(12) United States Patent
Miyazawa

(10) Patent No.: US 10,052,798 B2
(45) Date of Patent: Aug. 21, 2018

(54) LIGHT-TRANSMITTING IMPRINTING MOLD AND METHOD FOR MANUFACTURING LARGE-AREA MOLD

(71) Applicant: SOKEN CHEMICAL & ENGINEERING Co., Ltd., Tokyo (JP)

(72) Inventor: Yukihiro Miyazawa, Saitama (JP)

(73) Assignee: SOKEN CHEMICAL & ENGINEERING CO., LTD., Tokyo (JP)

(*) Notice: Subject to any disclaimer, the term of this patent is extended or adjusted under 35 U.S.C. 154(b) by 353 days.

(21) Appl. No.: 14/651,765

(22) PCT Filed: Jan. 21, 2014

(86) PCT No.: PCT/JP2014/051129
§ 371 (c)(1),
(2) Date: Jun. 12, 2015

(87) PCT Pub. No.: WO2014/115728
PCT Pub. Date: Jul. 31, 2014

(65) Prior Publication Data
US 2015/0306792 A1    Oct. 29, 2015

(30) Foreign Application Priority Data

Jan. 24, 2013   (JP) ................. 2013-011254

(51) Int. Cl.
*B29C 59/00*   (2006.01)
*B29C 35/08*   (2006.01)
(Continued)

(52) U.S. Cl.
CPC ...... *B29C 35/0888* (2013.01); *B29C 35/0805* (2013.01); *B29C 35/0894* (2013.01);
(Continued)

(58) Field of Classification Search
CPC . B29C 35/0805; B29C 35/0888; B29C 59/02; B29C 59/026; B29C 35/0894; B29C 59/022; B29C 2059/023; B29C 2035/0827
(Continued)

(56) References Cited

U.S. PATENT DOCUMENTS 6,696,220 B2 *  2/2004  Bailey ................. B29C 35/0888
                                                            425/385
7,794,222 B2 *  9/2010  Suehira ................. B82Y 10/00
                                                            425/385
(Continued)

FOREIGN PATENT DOCUMENTS

JP          4262271 B         4/2007
JP       2010258326 A        11/2010
(Continued)

OTHER PUBLICATIONS

Extended European Search Report dated Aug. 31, 2016, including the Supplementary European Search Report and the European Search Opinion, in connection with counterpart EP Application No. 14743376.7 (7 pgs.).
(Continued)

*Primary Examiner* — Joseph S Del Sole
*Assistant Examiner* — Thu Khanh T Nguyen
(74) *Attorney, Agent, or Firm* — Maier & Maier, PLLC

(57) ABSTRACT

An imprint method including the steps of: an exposing step to irradiate a photo curing resin, coated on a large-area substrate, with a curing light while the light-transmitting imprint mold is pressed against the photo curing resin, an amount of the curing light applied onto the photo curing resin in a light shielding region provided with the light shielding member made less than an amount of the curing light applied onto the photo curing resin in a light transmit-
(Continued)

ting region of the mold so that a portion of the photo curing resin in the light shielding region is semi-cured by the use of the light shielding member provided so as to reproduce the concave-convex pattern of the transparent substrate.

6 Claims, 4 Drawing Sheets

(51) Int. Cl.
    *B29C 59/02*     (2006.01)
    *G03F 7/00*     (2006.01)

(52) U.S. Cl.
    CPC ............ *B29C 59/02* (2013.01); *B29C 59/022* (2013.01); *B29C 59/026* (2013.01); *G03F 7/0002* (2013.01); *B29C 2035/0827* (2013.01); *B29C 2059/023* (2013.01); *B29K 2995/0026* (2013.01)

(58) Field of Classification Search
    USPC .............................................. 425/174.4, 385
    See application file for complete search history.

(56) References Cited

U.S. PATENT DOCUMENTS

| | | | |
|---|---|---|---|
| 8,011,916 B2* | 9/2011 | Suehira | ............... B29C 35/0894 |
| | | | 425/385 |
| 2007/0054097 A1 | 3/2007 | Suehira et al. | |
| 2008/0237936 A1 | 10/2008 | Park et al. | |
| 2009/0023288 A1* | 1/2009 | Jeong | .................... B82Y 10/00 |
| | | | 438/670 |
| 2009/0224436 A1 | 9/2009 | Mikami et al. | |
| 2011/0104389 A1 | 5/2011 | Bryan-Brown et al. | |
| 2011/0284499 A1 | 11/2011 | Suehira et al. | |
| 2013/0161869 A1 | 6/2013 | Yamamoto et al. | |

FOREIGN PATENT DOCUMENTS

| | | |
|---|---|---|
| JP | 2013000944 A | 1/2013 |
| JP | 2013038117 A | 2/2013 |
| JP | 2013161997 A | 8/2013 |
| WO | 2012164824 A | 12/2012 |

OTHER PUBLICATIONS

International Search Report dated Apr. 1, 2014 from corresponding International Patent Application No. PCT/JP2014/051129; 2pgs.

\* cited by examiner

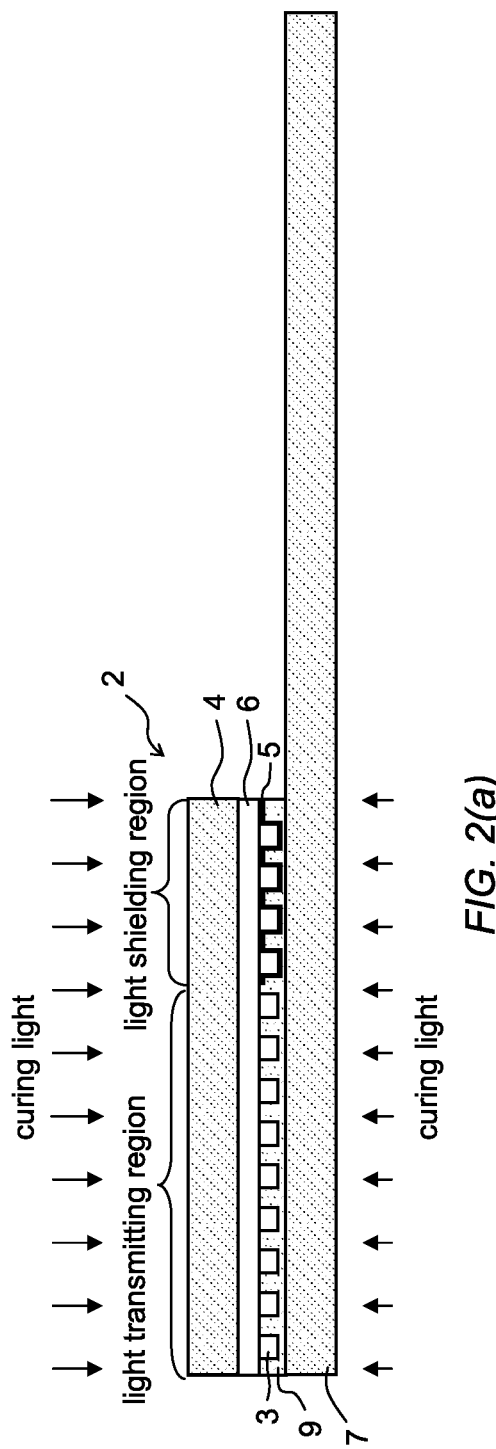
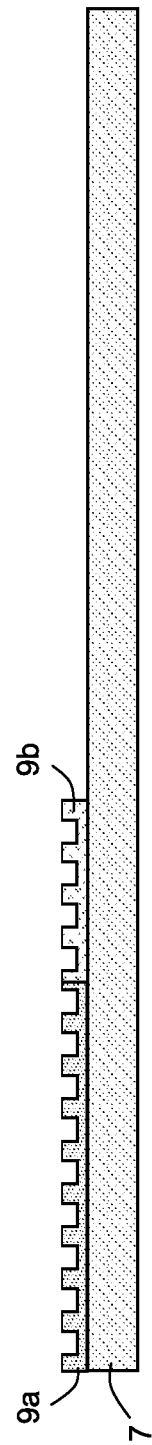

LIGHT-TRANSMITTING IMPRINTING MOLD AND METHOD FOR MANUFACTURING LARGE-AREA MOLD

TECHNICAL FIELD

The present invention relates to a light-transmitting imprint mold, and to a method for manufacturing a large-area mold.

BACKGROUND

Imprint technology is a fine processing technology, which uses a mold having a reverse pattern of the desired fine concave-convex pattern. The mold is pressed against a transferring material on a substrate, thereby transferring the pattern of the mold onto the transferring material. Here, the transferring material is a liquid-state resin for example. The fine concave-convex pattern can vary between a nano-scale pattern of 10 nm-level size to a 100 µm-level size. The reverse pattern is used in a wide range of field including semiconductor materials, optical materials, recording media, micro machines, biotechnology, and environmental protection.

Here, molds having a nano-scale fine concave-convex pattern on its surface are expensive since it takes long time to form the pattern. Therefore, it is difficult to enlarge molds having the nano-scale fine concave-convex pattern on its surface (large-area molds).

Accordingly, in Patent Literature 1, imprint using a small mold is repeated by shifting the position of the mold so that the processed regions do not overlap with each other, thereby achieving imprint for a large area (step and repeat).

CITATION LIST

Patent Literature

Patent Literature 1: JP 4262271B

SUMMARY OF THE INVENTION

Problems to be Solved by the Invention

However, regarding the method described in Patent Literature 1, alignment of the mold need be made with extremely high accuracy, and thus was problematic in that an imprint apparatus with such high accuracy is very expensive. In addition, when the accuracy of alignment is low, the concave-convex pattern already formed can be destroyed when the mold is pressed onto the concave-convex pattern already formed, and a space can be formed in between the concave-convex pattern already formed and the position at which the mold is subsequently pressed, thereby resulting in non-continuous concave-convex pattern.

The present invention has been made by taking the aforementioned circumstanced into consideration. An object of the present invention is to provide a light-transmitting imprint mold which can form the concave-convex pattern continuously even when the alignment has low accuracy, and to provide a method for imprint using such mold.

Means to Solve the Problem

According to the present invention, a light-transmitting imprint mold, comprising:

a transparent substrate having a patterned region onto which a concave-convex pattern is formed; and a light shielding member provided on the patterned region; wherein the light shielding member is provided at an edge portion of the patterned region so as to cover the concave-convex pattern, both of a concave portion and a convex portion of the concave-convex pattern being continuously covered; and a surface profile of the light shielding member reproduces the concave-convex pattern, is provided.

In Patent Literature 1, a light shielding member is provided at a non-patterned portion. Here, the present invention has a different basic concept, and a light shielding member need be provided so as to cover the concave-convex pattern of the mold and so that the surface profile of the light shielding member reproduce the concave-convex pattern. When such light shielding member is provided, difference in degree of exposure regarding the photo curing resin can be provided between the region having the light shielding member (light shielding region) and the other region (light transmitting region). Then, by adjusting the amount of exposure, the liquid-state photo curing resin in the light shielding region can be semi-cured to a degree in which the profile of the reverse pattern of the concave-convex pattern is maintained for a short period of time.

Subsequently, the mold is arranged so that the light transmitting region of the mold is positioned on the semi-cured photo curing resin. When the concave-convex pattern of the mold is pressed, the pattern already formed on the semi-cured photo curing resin easily deforms so as to have a reverse pattern profile following the concave-convex pattern of the mold newly pressed. Since the semi-cured photo curing resin can be easily deformed, the pattern already formed would not be destroyed, but is deformed into a new reverse pattern.

When the mold of the present invention is used, the alignment of the mold is considered sufficient with a level at which the mold is moved so that the edge of the light transmitting region is positioned on the semi-cured photo curing resin. Therefore, alignment need not be done with high accuracy as in Patent Literature 1, allowing forming of continuous reverse pattern of the concave-convex pattern of the mold even by use of a relatively reasonably priced imprint apparatus with modest accuracy.

Hereinafter, various embodiments of the present invention will be exemplified. The embodiments provided hereinafter can be combined with each other.

Preferably, the transparent substrate comprises a light-transmitting resin.

Preferably, the light shielding member comprises a metal film.

In addition, in accordance to another aspect of the present invention, an imprint method comprising the steps of:

an exposing step to irradiate a photo curing resin, coated on a large-area substrate, with a curing light while the afore-mentioned light-transmitting imprint mold is pressed against the photo curing resin, an amount of the curing light applied onto the photo curing resin in a light shielding region provided with the light shielding member being less than an amount of the curing light applied onto the photo curing resin in a light transmitting region of the mold so that a portion of the photo curing resin in the light shielding region is semi-cured;

a separating step to separate the mold from the photo curing resin after the exposing step;

a moving step to move the mold so that an end of the light transmitting region of the mold is positioned on the semi-cured portion of the photo curing resin; and a repeating step to repeat the exposing step and the separating step with the mold positioned at a position after the moving step, is provided.

Preferably, the photo curing resin is irradiated from both of the mold side and the large-area substrate side in the exposing step.

Preferably, the light shielding member attenuates the curing light, and the photo curing resin is irradiated with the curing light only from the mold side.

BRIEF DESCRIPTION OF THE DRAWINGS

In FIG. 2, (a) and (b) are each cross sectional view for explaining an exposing step and a separating step of the imprint method of the first embodiment of the present invention.

DESCRIPTION OF EMBODIMENTS

Hereinafter, the preferred embodiments of the present invention will be described specifically with reference to the drawings.

1. First Embodiment 1-1. Light-transmitting Imprint Mold

Figure 1A:
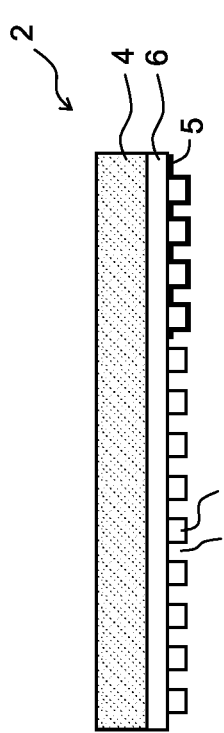
In FIG. 1, (a) is a cross sectional view of a mold according to the first embodiment of the present invention, and (b) is a modified example thereof.

As shown in FIG. 1(a), the light-transmitting imprint mold of the first embodiment of the present invention is a light-transmitting imprint mold 2 comprising a transparent substrate 4 having a patterned region onto which a concave-convex pattern 3 is formed, and a light shielding member 5 provided on the patterned region. Here, the light shielding member 5 is provided at the edge portion of the patterned region so as to cover the concave-convex pattern 3, both of the concave portion 3a and the convex portion 3b being continuously covered. In addition, the surface profile of the light shielding member reproduces the concave-convex pattern 3.

Such imprint mold 2 can be formed using a known imprint technique. In one example, as shown in FIG. 1(a), the imprint mold comprises a transparent substrate 4, and a transparent resin layer 6 provided on the transparent substrate 4, the transparent resin layer 6 having a desired fine concave-convex pattern 3.

(1) Transparent Substrate 4

The transparent Substrate 4 is formed with a transparent material such as a resin substrate, quartz substrate, and the like. The resin substrate is preferable when forming a resin mold having flexibility. For example, the resin substrate is a substrate comprising one type of a resin selected from the group consisting of polyethylene terephthalate, polycarbonate, polyester, polyolefin, polyimide, polysulphone, polyether sulphone, cyclic polyolefin, and polyethylene naphthalate.

(2) Transparent Resin Layer 6, Concave-convex Pattern 3, Patterned Region

As the resin for forming the transparent resin layer 6, any one of the thermoplastic resin, thermosetting resin, or photo curing resin can be used. Here, in terms of productivity and usability, photo curing resin is preferable. Specific examples include acrylic resin, styrene resin, olefin resin, polycarbonate resin, polyester resin, epoxy resin, silicone resin and the like. In addition, the resin can contain a releasing component such as a fluorine compound, a long-chain alkyl compound, and wax.

The thickness of the afore-mentioned transparent resin layer 6 is usually 50 nm to 1 mm, preferably 50 nm to 500 µm. When the thickness is in such range, it is easy to perform imprint processing.

When the resin forming the transparent resin layer 6 is a thermoplastic resin, a mold for forming the concave-convex pattern is pressed against the transparent resin layer 6 with a pressing pressure of 0.5 to 50 MPa for 10 to 600 seconds while the transparent resin layer 6 is kept under heating at a temperature higher than the glass transition temperature (Tg). Subsequently, the transparent resin layer 6 is cooled to a temperature below Tg, followed by separation of the mold from the transparent resin layer 6. Accordingly, the concave-convex pattern 3 is formed on the transparent resin layer 6. On the other hand, when the resin forming the transparent resin layer 6 is a photo-curing resin, the mold for forming the reverse pattern is pressed against the liquid-state transparent resin layer 6, and then the transparent resin layer 6 is irradiated with curing light (general term for energy ray capable of curing the resin such as UV light, visible light, electron beam and the like) to cure the transparent resin layer 6. Subsequently, the mold is separated to give the transparent resin layer 6 having the concave-convex pattern 3. The transparent resin layer 6 can be irradiated with the light from the transparent substrate 4 side, or from the mold side when the mold is transparent with respect to the light. In addition, when the resin forming the transparent resin layer 6 is a thermosetting resin, the transparent resin layer 6 is heated up to the curing temperature in a condition where the mold for forming the reverse pattern is pressed against the liquid-state transparent resin layer 6, thereby curing the transparent resin layer 6. Subsequently, the mold is separated from the transparent resin layer 6 to give the transparent resin layer 6 having the concave-convex pattern 3. The transparent resin layer 6 can be irradiated with the light from the transparent substrate 4 side, or from the mold side when the mold is transparent with respect to the light.

There is no particular limitation regarding the concave-convex pattern 3 of the transparent resin layer 6. Here, a pattern having an interval of 10 nm to 2 mm, a depth of 10 nm to 500 µm, and a transferring area of 1.0 to $1.0 \times 10^6$ mm$^2$ is preferable, and a pattern having an interval of 20 nm to 20 µm, a depth of 50 nm to 1 µm, and a transferring area of 1.0 to $25 \times 10^6$ mm$^2$ is more preferable. When the pattern is regulated in such range, the concave-convex pattern 3 can be sufficiently transferred to the transferring body. As the surface pattern, moth-eye, line, cylinder, monolith, cone, polygonal pyramid, and microlens can be mentioned.

Figure 1B:
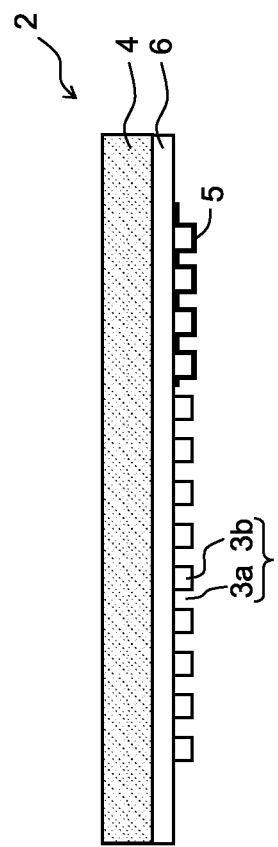

The patterned region in which the concave-convex pattern 3 is formed can be provided on the entirety of the transparent substrate 4 as shown in FIG. 1(a), or can be provided partially on the transparent substrate 4 as shown in FIG. 1(b).

The surface of the transparent resin layer 6 can be subjected to a releasing treatment to prevent the transparent resin layer 6 from adhering with the transferring material.

Here, the releasing treatment can include forming of a releasing layer (not shown). The releasing agent for forming the releasing layer (not shown) preferably comprises at least one agent selected from the group consisting of a fluorosilane coupling agent, a perfluoro compound having an amino group or a carboxyl group, and a perfluoroether compound having an amino group or a carboxyl group. More preferably, the releasing agent comprises at least one agent selected from the group consisting of a fluorosilane coupling agent, a one-end-aminated perfluoro(perfluoroether) compound, and a one-end-carboxylated perfluoro(perfluoroether) compound, either as a single compound or a mixture of single compound and multiple compounds. When the releasing agent as described above is used, the adhesion property of the releasing layer formed by the releasing agent with respect to the transparent resin layer 6 would be excellent, and the releasing property of the resin for imprint from the releasing layer formed by the releasing agent would be excellent. The thickness of the releasing layer (not shown) is preferably 0.5 to 20 nm, more preferably 0.5 to 10 nm, and most preferably 0.5 to 5 nm. Here, in order to improve the adhesion between the releasing layer and the transparent resin layer 6, the transparent resin layer 6 can be added with an additive having a functional group capable of bonding with the releasing agent, as disclosed in WO 2012/018045.

(3) Light Shielding Member 5

As shown in FIG. 1(a), the light shielding member 5 is formed at the edge portion of the patterned region in which the concave-convex pattern 3 is formed. There is no particular limitation regarding the forming method and the materials of the light shielding member 5, so long as it can achieve the object of shielding the curing light. In one example, the light shielding member 5 can be formed by adhering metal materials such as Cr onto the concave-convex pattern 3 using the sputtering technique. The light shielding member 5 can be formed with an organic material such as acrylic material, urethane material, and polycarbonate material; or with an inorganic material such as carbon material. Other materials such as pigment can be added to these materials. The light shielding member can be provided linearly along one side of the patterned region, along two sides of the patterned region in an L-shape, along more than two sides of the patterned region, or along the whole circumference of the patterned region.

There is no particular limitation regarding the width of the light shielding member 5. For example, it is preferable to provide the light shielding member 5 so as to have a width of 2 to 20% of the width of the patterned region. When the width of the light shielding member 5 is too narrow, the benefit of providing the light shielding member 5 cannot be obtained, and when the width of the light shielding member 5 is too wide, the efficiency of the imprint decreases.

The light shielding member 5 is formed so as to continuously cover both of the concave portion 3a and the convex portion 3b of the concave-convex pattern 3, rather than being formed only at the concave portion 3a and the convex portion 3b. In addition, the light shielding member is formed so that its surface profile reproduces the concave-convex pattern 3. Accordingly, the light shielding member 5 can be pressed against the transferring material to transfer the concave-convex pattern 3 onto the transferring material.

There is no particular limitation regarding the thickness of the light shielding member 5. Here, when the light shielding member 5 is too thin, the light shielding property cannot be achieved, and when the light shielding member 5 is too thick, the concave-convex pattern 3 cannot be reproduced appropriately. Accordingly, the thickness is selected so as to maintain necessary light shielding property and to appropriately reproduce the concave-convex pattern 3 onto the light shielding member 5. The thickness of the light shielding member 5 is, for example, 0.01 to 0.99 times of the height of the concave-convex pattern. Preferably, the thickness of the light shielding member 5 is 0.01 to 0.5 times of the height of the concave-convex pattern. Otherwise, the thickness of the light shielding member 5 is 1 to 100 nm. Specific examples of the thickness of the light shielding member 5 are 0.01, 0.05, 0.1, 0.2, 0.3, 0.4, 0.5, 0.6, 0.7, 0.8, 0.9, 0.95, and 0.99 times of the height of the concave-convex pattern, or 1, 5, 10, 20, 30, 40, 50, 60, 70, 80, 90, and 100 nm, and may be in the range of two values selected from the values exemplified herein.

The light shielding member 5 can be the one which completely shields the curing light (shielding degree of 100%), or can be the one which attenuates the curing light (shielding degree of 50% for example). That is, in the present specification, "shield" is a term intended to mean both of complete shielding and attenuated shielding. In the former case, the photo curing resin in the region where the light shielding member 5 is provided (light shielding region) is completely shielded when exposure is performed from the mold side during the imprint method described later. Accordingly, in order to have the photo curing resin in this region semi-cured, exposure need be performed from the large-area substrate side onto which the transferring material is coated. On the other hand, in the latter case, the photo curing resin in the light shielding region is subjected to exposure to some extent. Accordingly, the imprint method of the present invention can be performed even when the exposure is not conducted from the large-area substrate side. The shielding degree shall be varied in accordance with the physical properties of the photo curing resin. Examples of the shielding degree are 10, 20, 30, 40, 50, 60, 70, 80, and 90%, and may be in the range of two values selected from the values exemplified herein.

In addition, the shielding member 5 may be subjected to the releasing treatment mentioned with respect to the transparent resin layer 6. Accordingly, adhesion of the transferring material onto the light shielding member 5 can be prevented.

1-2. Imprint Method

Next, an example of the imprint method using the aforementioned mold will be explained. The imprint method shown hereinafter is merely an example, and the mold can be used in a different imprint method.

Figure 3A:
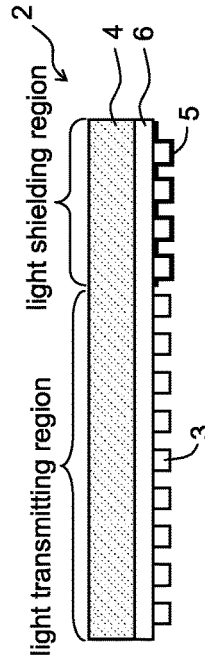
In FIG. 3, (a) and (b) are each cross sectional view for explaining a moving step and a repeating step, and (c) is a cross sectional view showing the structure obtained after a second exposing step and a separating step.
Figure 3B:
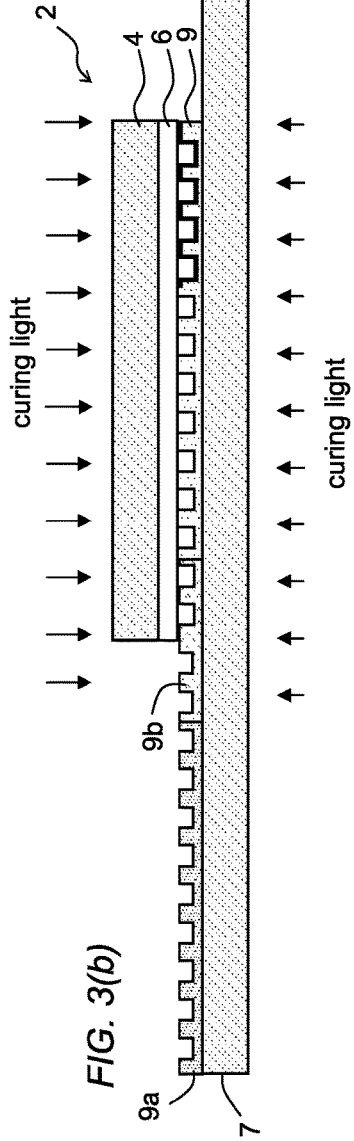
Figure 3C:
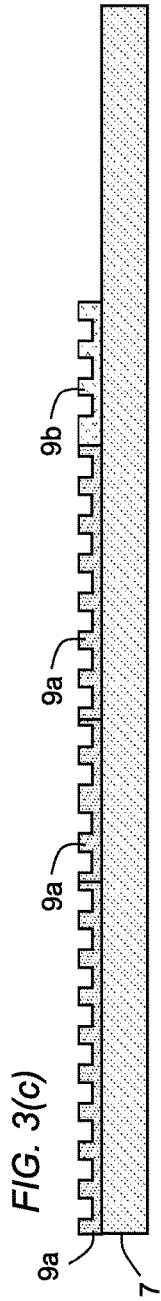

The imprint method according to the first embodiment of the present invention is, as shown in FIG. 2 and FIG. 3, comprises the steps of: an exposing step to irradiate a photo curing resin 9, coated on a large-area substrate, with a curing light while the afore-mentioned light-transmitting imprint mold 2 is pressed against the photo curing resin 9, an amount of the curing light applied onto the photo curing resin 9 in a light shielding region provided with the light shielding member 5 being less than an amount of the curing light applied onto the photo curing resin in a light transmitting region of the mold 2 so that a portion of the photo curing resin in the light shielding region is semi-cured;

a separating step to separate the mold 2 from the photo curing resin after the exposing step;

a moving step to move the mold 2 so that an end of the light transmitting region of the mold is positioned on the semi-cured portion of the photo curing resin; and a repeating step to repeat the exposing step and the separating step with the mold positioned at a position after the moving step.

(1) Exposing Step

As shown in FIG. 2(a), in the exposing step, the liquid-state photo curing resin 9 is coated onto the large-area substrate 7, and then the photo curing resin 9 is irradiated with the curing light in a condition where the concave-convex pattern 3 of the mold 2 is pressed against the photo curing resin 9. In the present embodiment, the photo curing resin 9 is irradiated with the curing light from both of the mold 2 side and the large-area substrate 7 side. The curing light from the mold 2 side transmits the mold 2 as it is in the light transmitting region. Accordingly, the photo curing resin 9 is irradiated with the curing light and is fully cured. On the other hand, in the light shielding region, the light shielding member 5 shields the curing light, and thus the photo curing resin 9 is not irradiated with the curing light. In such condition, the photo curing resin 9 in the light shielding region would remain as a liquid. Accordingly, the photo curing resin 9 in the light shielding region is irradiated with the curing light from the large-area substrate 7 side in order to obtain a semi-cured photo curing resin 9. The curing degree of the photo curing resin 9 in the light shielding region can be adjusted by varying the amount of the curing light from the large-area substrate 7 side.

There is no particular limitation regarding the material of the large-area substrate 7. Here, the large-area substrate 7 is preferably a resin substrate. By using the resin substrate, a resin mold having the desired size can be obtained (also capable of obtaining a large-area mold) by the imprint method of the present invention. The resin constituting the resin substrate is, for example, one resin selected from the group consisting of a polyethylene terephthalate resin, a polycarbonate resin, a polyester resin, a polyolefin resin, a polyimide resin, a polysulphone resin, a polyether sulphone resin, a cyclic polyolefin resin, and a polyethylene naphthalate resin. In addition, it is preferable that the large-area substrate 7 is provided with an adequate flexibility, and the thickness of the resin substrate is preferably 25 to 500 μm.

As an example of the photo curing resin 9, an acrylic resin, a styrene resin, an olefin resin, a polycarbonate resin, a polyester resin, an epoxy resin, and a silicone resin can be mentioned. In addition, the resin can contain a releasing component such as a fluorine compound, a long-chain alkyl compound, and wax.

(2) Separating Step

Subsequently, after the photo curing resin 9 is irradiated with the curing light, the mold 2 is separated from the photo curing resin 9. Accordingly, as shown in FIG. 2(b), a structure in which a reverse pattern of the concave-convex pattern 3 is formed on a fully-cured photo curing resin 9a and a semi-cured photo curing resin 9b, is obtained. The semi-cured photo curing resin 9b is cured to an extent where the reverse pattern of the concave-convex pattern 3 can be maintained for a short period of time. Accordingly, the profile of the reverse pattern is maintained even after the mold 2 is separated from the photo curing resin 9. However, since the photo curing resin 9b is not fully cured, the profile can be deformed easily by applying some force.

(3) Moving Step

Subsequently, as shown in FIG. 3(a), the mold 2 is moved to the next processing region. Here, strict alignment of the mold 2 is not necessary, and the mold 2 should be arranged so that the end of the light transmitting region of the mold is positioned on the semi-cured photo curing resin 9b.

Therefore, the wider the width of the light shielding region of the mold 2, the lower the accuracy of the alignment required.

(4) Repeating Step

Subsequently, as shown in FIG. 3(b), the photo curing resin 9 is irradiated with the curing light in a condition where the mold 2 is pressed against the photo curing resin 9 of the large-area substrate 7. Here, the reverse pattern of the concave-convex pattern 3 already formed on the semi-cured photo curing resin easily deforms, and forms a profile following the concave-convex pattern 3 of the newly pressed mold. Accordingly, since the semi-cured photo curing resin 9b can be easily deformed, the pattern formed is deformed into a new reverse pattern rather than being destroyed.

In this step, the semi-cured photo curing resin 9b formed in the immediately preceding step is also irradiated with the curing light, and thus the semi-cured photo curing resin 9b is formed into a fully cured photo curing resin 9a. Further, also in this step, a semi-cured photo curing resin 9b is newly formed in the light shielding region.

By repeating the separating step, the moving step, and the exposing step for required times, a large-area mold having a desired size can be formed.

2. Second Embodiment

Figure 4:
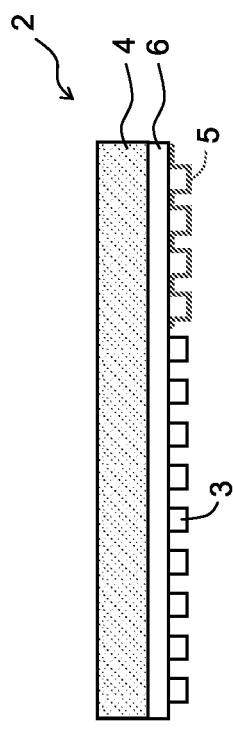
FIG. 4 is a cross sectional view of the mold of the second embodiment of the present invention.

FIG. 4 shows the light-transmitting imprint mold 2 according to the second embodiment of the present invention. The constitution of the mold 2 is similar to that of the first embodiment, however, the light shielding member 5 attenuates the curing light.

Figure 5:
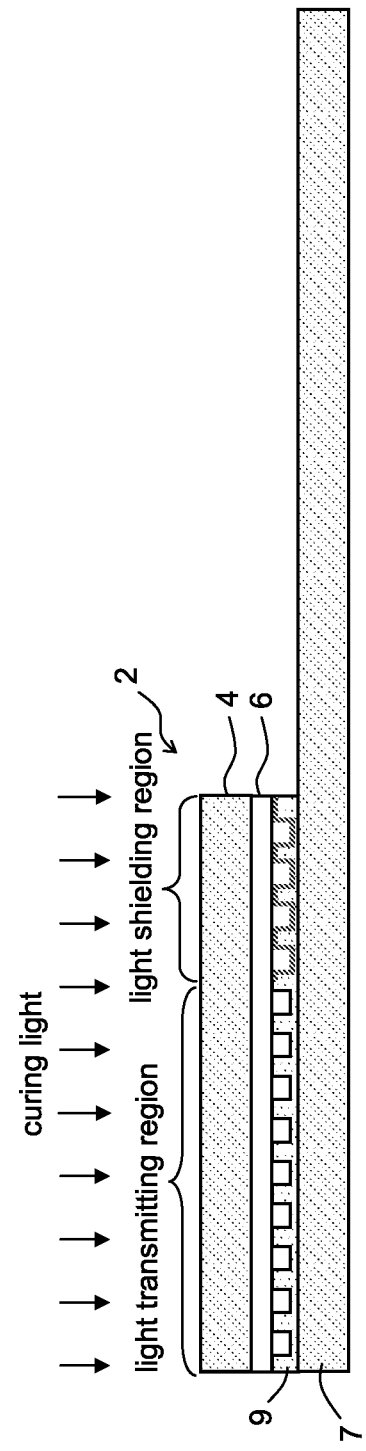
FIG. 5 is a cross sectional view for explaining the imprint method of the second embodiment of the present invention.

When such mold is used, as shown in FIG. 5, the photo curing resin 9 is irradiated with the curing light from only the mold 2 side. In the light transmitting region, the curing light transmits the mold 2 as it is. Accordingly, the photo curing resin 9 is irradiated with the curing light. In the light shielding region, the curing light is attenuated by the light shielding member 5. Accordingly, the photo curing resin 9 is irradiated with attenuated curing light. By adjusting the strength of the curing light and the transmittancy of the light shielding member 5, the photo curing resin 9 can be semi-cured. The succeeding step can be conducted in a similar manner as the first embodiment.

EXPLANATION OF SYMBOLS

2: light-transmitting imprint mold, 3: concave-convex pattern, 4: transparent substrate, 6: transparent resin layer, 7: large-area substrate, 9: photo curing resin

The invention claimed is:

1. A light-transmitting imprint mold, comprising:
   a transparent substrate having a patterned region onto which a concave-convex pattern is formed; and
   a light shielding member provided on the patterned region; wherein
   the light shielding member is provided at an edge portion of the patterned region so as to cover the concave-convex pattern, both of a concave portion and a convex portion of the concave-convex pattern being continuously covered; and
   a surface profile of the light shielding member reproduces the concave-convex pattern.

2. The light-transmitting imprint mold of claim 1, wherein the transparent substrate comprises a light-transmitting resin.

3. The light-transmitting imprint mold of claim 1, wherein the light shielding member comprises a metal film.

4. An imprint method comprising the steps of:
an exposing step to irradiate a photo curing resin, coated on a large-area substrate, with a curing light while the light-transmitting imprint mold of claim 1 is pressed against the photo curing resin, an amount of the curing light applied onto the photo curing resin in a light shielding region provided with the light shielding member being less than an amount of the curing light applied onto the photo curing resin in a light transmitting region of the mold so that a portion of the photo curing resin in the light shielding region is semi-cured;
a separating step to separate the mold from the photo curing resin after the exposing step;
a moving step to move the mold so that an end of the light transmitting region of the mold is positioned on the semi-cured portion of the photo curing resin; and
a repeating step to repeat the exposing step and the separating step with the mold positioned at a position after the moving step.

5. The method of claim 4, wherein the photo curing resin is irradiated from both of the mold side and the large-area substrate side in the exposing step.

6. The method of claim 4, wherein the light shielding member attenuates the curing light, and the photo curing resin is irradiated with the curing light only from the mold side.

* * * * *